(12) United States Patent
Irie

(10) Patent No.: US 6,730,996 B2
(45) Date of Patent: May 4, 2004

(54) SEMICONDUCTOR DEVICE

(75) Inventor: Masaaki Irie, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 21 days.

(21) Appl. No.: 10/120,422

(22) Filed: Apr. 12, 2002

(65) Prior Publication Data
US 2003/0080412 A1 May 1, 2003

(30) Foreign Application Priority Data
Oct. 30, 2001 (JP) ........................................ 2001-331946

(51) Int. Cl.[7] ................................................. H01L 23/48
(52) U.S. Cl. ........................ 257/688; 257/706; 257/784
(58) Field of Search ................................. 257/688, 706, 257/707, 712, 719, 784

(56) References Cited

U.S. PATENT DOCUMENTS 6,097,203 A * 8/2000 Parker et al. ................ 324/763

FOREIGN PATENT DOCUMENTS

| JP | 60-116153 | 6/1985 |
|---|---|---|
| JP | 5-121602 | 5/1993 |

* cited by examiner

Primary Examiner—John F. Niebling
Assistant Examiner—Christopher Lattin
(74) Attorney, Agent, or Firm—Leydig, Voit & Mayer, Ltd.

(57) ABSTRACT

In a semiconductor device, at the time of resin sealing, a conductor within the resin is exposed at a surface on which a cooling device is to be mounted. With this configuration, a semiconductor device is capable of determining deterioration in cooling efficiency of the cooling device mounted on the package.

6 Claims, 4 Drawing Sheets

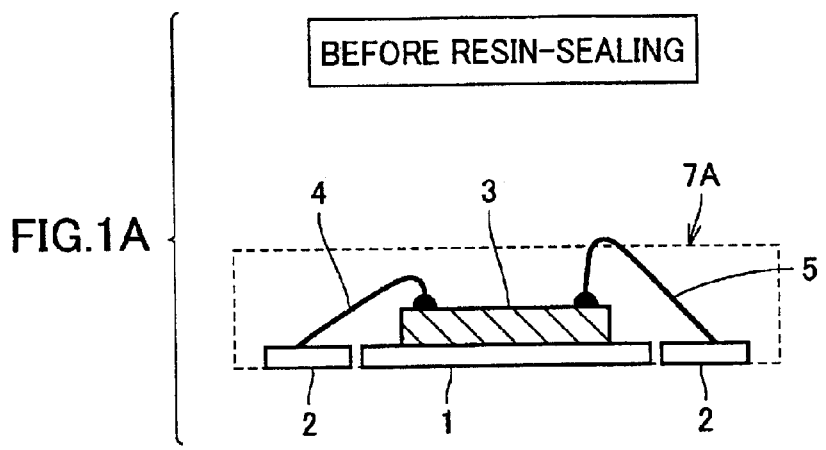
FIG.1A BEFORE RESIN-SEALING
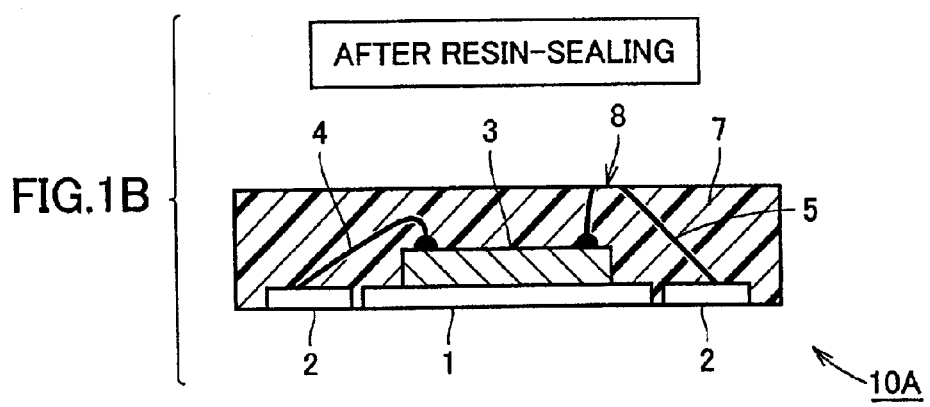
FIG.1B AFTER RESIN-SEALING

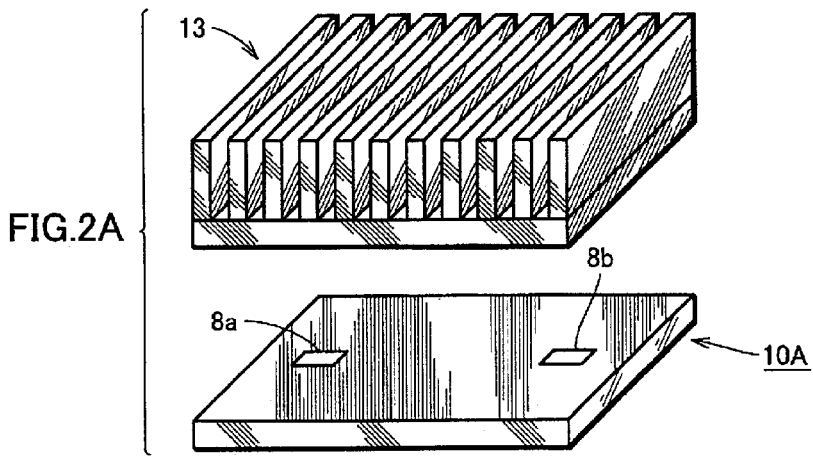
FIG.2A
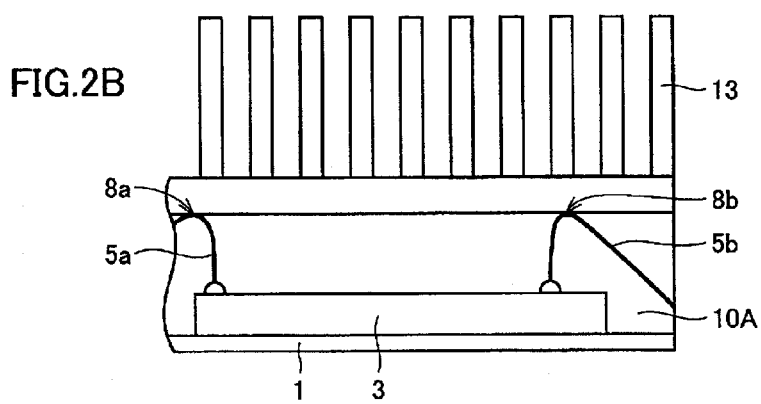
FIG.2B
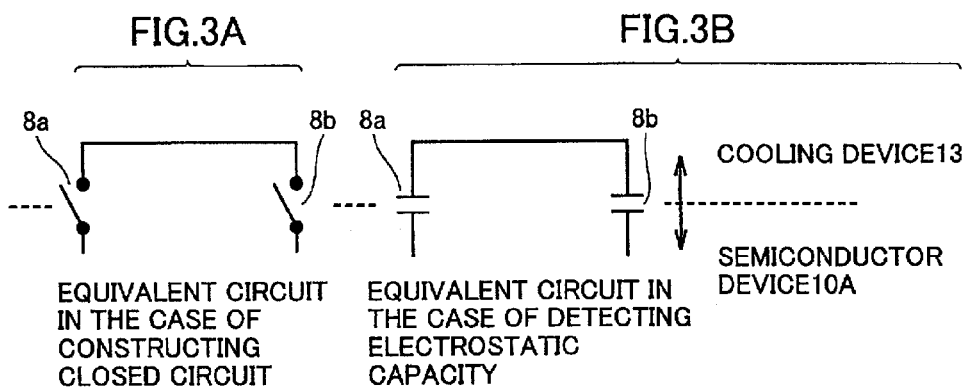
FIG.3A — EQUIVALENT CIRCUIT IN THE CASE OF CONSTRUCTING CLOSED CIRCUIT
FIG.3B — EQUIVALENT CIRCUIT IN THE CASE OF DETECTING ELECTROSTATIC CAPACITY

SEMICONDUCTOR DEVICE

BACKGROUND OF THE INVENTION

1. Field of the Invention

The present invention relates to a semiconductor device and, more particularly, to a structure of a semiconductor device capable of determining the degree of contact between cooling means and the semiconductor device.

2. Description of the Background Art

Conventionally, in a semiconductor device having a large heating value, to cool the semiconductor device, a cooling device is attached to the semiconductor device. In order to improve the cooling efficiency, good contact between the semiconductor device and the cooling device (both of them are in contact with each other so that an effect of the cooling device can be sufficiently displayed) is important.

In the case where the semiconductor device and the cooling device are closely in contact with each other (in the case of good contact), heat from the semiconductor device is sufficiently transmitted to the cooling device, and it means that the semiconductor device is cooled effectively. On the other hand, when the semiconductor device and the cooling device are in contact with each other but not closely attached (in the case of poor contact such as a case where a space exists partly or a case where areas to be in contact are deviated from each other), the semiconductor device is not sufficiently cooled by the cooling device. Consequently, a problem such as erroneous operation due to thermal runaway of the semiconductor device or destruction or the like of the semiconductor device occurs.

Conventionally, to improve the contact between the semiconductor device and the cooling device, a method of making the semiconductor device and the cooling device in contact with each other with pressure by using a resilient member such as a spring, or a method of providing a recess and a projection which are fit to each other in the contact portion of the semiconductor device and that of the cooling device to enlarge the contact area between the semiconductor device and the cooling device is employed.

However, in the cases such that a deviation occurs at the time of attaching the cooling device to the semiconductor device, or a positional deviation occurs between the cooling device and the semiconductor device by an impact from the outside after being fixed, except for actually detecting an increase in temperature of the semiconductor device, there is no method of detecting deterioration in the cooling efficiency of the cooling device. Consequently, there are problems such that erroneous operation of the semiconductor device, and deterioration or destruction in the semiconductor device due to a sharp temperature rise cannot be avoided.

SUMMARY OF THE INVENTION

An object of the invention is to provide a semiconductor device capable of knowing deterioration in cooling efficiency of a cooling device by a method other than a method of detecting a temperature rise in the semiconductor device.

According to the invention, a semiconductor device which discharges heat by being in contact with cooling means, includes: contact means provided in a mounting face on which the cooling means is to be mounted so that its level becomes almost the same as that of the mounting face; and measuring means provided between the cooling means and the contact means, for measuring the degree of contact between the cooling means and the semiconductor device.

By enabling the degree of contact between the cooling means and the semiconductor device to be measured, when a deviation occurs in attachment between the cooling device and the semiconductor device, the deviation can be detected before the temperature of the semiconductor device rises. As a result, when it is determined that a deviation occurs in attachment between the cooling device and the semiconductor device, by regulating or interrupting the supply of power to the semiconductor device, erroneous operation of the semiconductor device and deterioration and destruction in the semiconductor device due to a sharp temperature rise can be avoided. Thus, the operation reliability of the semiconductor device can be improved.

In the invention, preferably, the contact means has a first contact terminal and a second contact terminal which come into electric contact with the cooling means, and the measuring means forms a closed circuit in which the first and second contact terminals serve as switching elements which come into contact with the cooling means, and measures whether the closed circuit is closed or not by using the switching elements. By enabling whether the closed circuit is closed or not to be detected and separately providing a resetting circuit, a power supply circuit can be controlled.

In the invention, preferably, the contact means has a first contact terminal and a second contact terminal which come into contact with the cooling means via an insulating member, and the measuring means forms a closed circuit in which the first and second contact terminals serve as capacitative elements and measures electrostatic capacity of the closed circuit. By enabling the change in the electrostatic capacity in the closed circuit to be measured, a delay circuit obtained by combining the closed circuit and a resistor can be constructed, and the supply of power to the semiconductor device can be controlled on the basis of determination of delay time.

In the invention, preferably, the semiconductor device has a semiconductor chip, a plurality of internal electrodes, a plurality of electrodes provided for the semiconductor chip, a plurality of conductors for connecting the electrodes and the corresponding internal electrodes to each other, and a package member for sealing the semiconductor chip, the internal electrodes, the electrodes, and the conductors with a resin, and each of the first and second contact terminals is obtained by exposing a part of selected one of the conductors from the package member in the mounting face on which the cooling means is to be mounted.

Since each of the first and second contact terminals is formed by using a conductor as a part of components of the semiconductor device conventionally used, a semiconductor device having first and second contact terminals can be obtained without employing a new fabrication step while avoiding an increase in cost of providing the first and second contact terminals.

In the invention, preferably, the semiconductor device includes a semiconductor chip, a plurality of internal electrodes, a plurality of electrodes provided for the semiconductor chip, a plurality of conductors for connecting the electrodes and the internal electrodes to each other, and a package member for sealing the semiconductor chip, the internal electrodes, and the conductors with a resin, and each of the first and second contact terminals is obtained by exposing a part of selected one of the internal electrodes from the package member in the mounting face on which the cooling means is to be mounted.

Consequently, since each of the first and second contact terminals is formed by using the internal electrode as a part of components of the semiconductor device conventionally used, a semiconductor device having first and second contact terminals can be obtained without employing a new fabrication step while avoiding an increase in cost of providing the first and second contact terminals.

In the invention, preferably, a conductive paste is provided on and around the first and second contact terminals. With the configuration, the stable contact between the first and second contact terminals and the cooling device is achieved, and conduction between the first and second contact terminals and the cooling device can be obtained with reliability.

According to the invention, there is provided a method of manufacturing a semiconductor device which discharges heat by being in contact with cooling means, including a step of sealing components of the semiconductor device with a package member, the components being a semiconductor chip, a plurality of internal electrodes, a plurality of electrodes provided for the semiconductor chip, and a plurality of conductors for connecting the electrodes to the corresponding internal electrodes, and a removing step of removing a mounting face side with which the cooling means comes into contact of the package member by a predetermined thickness, each of the conductors being formed in a loop so as to open toward the mounting face side, and the removing step includes a step of forming a contact terminal made from an exposed area of the conductor on the mounting face side of the package member by removing the package member so that the apex of the loop of the conductor is exposed.

Consequently, in the case where it is difficult to form contact terminals exposed in the surface by a conventional manufacturing method such as a case where a film of resin is formed on the surface of the conductor, the contact terminal exposed in the surface with reliability can be formed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are cross sections each showing the structure of a semiconductor device in a first embodiment, FIG. 1A is a diagram showing a state of a semiconductor device 10A before sealing with a resin, and FIG. 1B is a diagram showing a state of semiconductor device 10A sealed with a resin;

FIGS. 2A and 2B are diagrams each showing a contact relation between a semiconductor device and a cooling device in the first embodiment, FIG. 2A is a general perspective view showing a state before semiconductor device 10A having contact terminals 8a and 8b on a mounting face on which a cooling device is disposed and a fin-type cooling device 13 come into contact with each other, and FIG. 2B is an enlarged cross section of a portion around contact terminals 8a and 8b in a state where semiconductor device 10A and fin-type cooling device 13 are in contact with each other;

FIGS. 3A and 3B are diagrams each showing the configuration of a circuit formed between the semiconductor device and the cooling device, FIG. 3A is a diagram showing an equivalent circuit of a case where a closed circuit is constructed between semiconductor device 10A and fin-type cooling device 13, and FIG. 3B is a diagram showing an equivalent circuit of a case where a circuit capable of detecting electrostatic capacity formed between the semiconductor device and the cooling device is constructed;

FIG. 4A is a general perspective view showing a state before a semiconductor device 10B having contact terminals 8a and 8b in a mounting face on which the cooling device is to be mounted and fin-type cooling device 13 come into contact with each other, and FIG. 4B is an enlarged cross section of a portion around contact terminals 8a and 8b in a state where semiconductor device 10B and fintype cooling device 13 are in contact with each other;

DESCRIPTION OF THE PREFERRED EMBODIMENTS

Figure 4A:
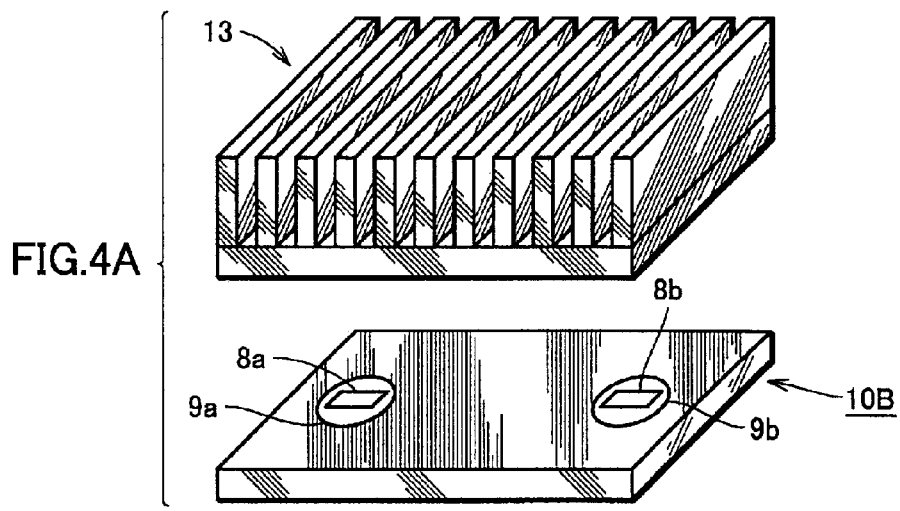
FIGS. 4A and 4B are diagrams showing the structure of a semiconductor device in a second embodiment and the contact relation between the semiconductor device and a cooling device.

The structure of a semiconductor device according to each of embodiments based on the invention will be described hereinbelow with reference to the drawings.

First Embodiment

Referring to FIGS. 1A and 1B to FIGS. 3A and 3B, the structure of a semiconductor device of a first embodiment and the contact relation between the semiconductor device and a cooling device will be described.

Structure of Semiconductor Device

Referring to FIGS. 1A and 1B, the sectional structure of a semiconductor device 10A in the embodiment will be described.

Semiconductor device 10A is a resin-sealed semiconductor device. A plurality of internal electrodes 2 are disposed in predetermined positions around a die pad 1, and a semiconductor chip 3 is provided on die pad 1. A plurality of electrodes provided on the top face of semiconductor chip 3 and corresponding internal electrodes 2 are connected via conductors 4 and 5 such as gold wires or aluminum wires.

Conventionally, conductors 4 and 5 are conventionally sealed with a resin so as not to be exposed from a surface 7A of a package member 7. In the semiconductor device in the embodiment, before sealing with a resin, as shown in FIG. 1A, selected conductor 5 is preliminarily routed so that the apex of conductor 5 formed in a loop is exposed at a level at which the surface 7A of package member 7 is supposed to be positioned. With the arrangement, as shown in FIG. 1B, the apex of the loop of conductor 5 becomes at almost the same level as that of the surface 7A of package member 7 (the surface on which the cooling device is to be disposed later), thereby forming a contact terminal 8 as contact means. The contact terminals are provided at least in two positions. The sinking amount of conductor 5 due to the flow of the resin at the time of sealing with package member 7 can be controlled by properly combining the viscosity of the resin used for package member 7, and hardness and diameter of conductor 5.

Contact Relation Between Semiconductor Device and Cooling Device

Referring to FIGS. 2A and 2B, the contact relation between the semiconductor device and the cooling device will be described.

As shown in FIG. 2B, in the case of connecting contact terminals 8a and 8b to a fin-type cooling device 13 made of a conductive material, a predetermined circuit can be formed between semiconductor device 10A and fin-type cooling device 13 via contact terminals 8a and 8b.

For example, the circuit diagram of FIG. 3A is a diagram showing an equivalent circuit in the case where a closed circuit is formed between semiconductor device 10A and fin-type cooling device 13 by regarding contact terminals 8a and 8b as switching elements 8a and 8b which come into contact with fin-type cooling device 13.

When the contact between semiconductor device 10A and fin-type cooling device 13 is good (when they are in close contact with each other), the on-state of switching elements 8a and 8b of the circuit shown in FIG. 3A can be detected. When something is wrong with the contact between semiconductor device 10A and fin-type cooling device 13 (when they are not in close contact with each other or they are not in contact with each other), the off-state of switching elements 8a and 8b of the circuit shown in FIG. 3A can be detected. That is, the closed circuit can serve as a determination circuit. By separately providing a resetting circuit, a power supply circuit of the semiconductor device can be controlled.

The circuit configuration as shown in FIG. 3B can be also realized. For example, in the case where an insulator is interposed between semiconductor device 10A and fin-type cooling device 13, it can be regarded that capacitative elements 8a and 8b are formed between contact terminals 8a and 8b of semiconductor device 10A and fin-type cooling device 13. By constructing the circuit capable of detecting electrostatic capacity, when the electrostatic capacity of the circuit becomes equal to or less than a predetermined reference value, it can be determined that the contact between semiconductor device 10A and fin-type cooling device 13 deteriorates. As a result, by determining a delay time of a delay circuit obtained by combining the circuit and a resistor, the power supply circuit of the semiconductor device can be controlled.

Action and Effect

In semiconductor device 10A in the embodiment, by enabling the degree of contact between cooling device 13 and semiconductor device 10A to be measured by using contact terminals 8a and 8b, if a deviation occurs in attachment between cooling device 13 and semiconductor device 10, the deviation can be detected before the temperature of semiconductor device 10A increases. As a result, when it is determined that a deviation occurs in attachment between cooling device 13 and semiconductor device 10A, by restricting or interrupting the supply of power to semiconductor device 10A, erroneous operation of semiconductor device 10A and deterioration or destruction in semiconductor device 10A due to a sharp temperature rise can be avoided. Thus, the operation reliability of semiconductor device 10A can be improved.

Second Embodiment

Figure 4B:
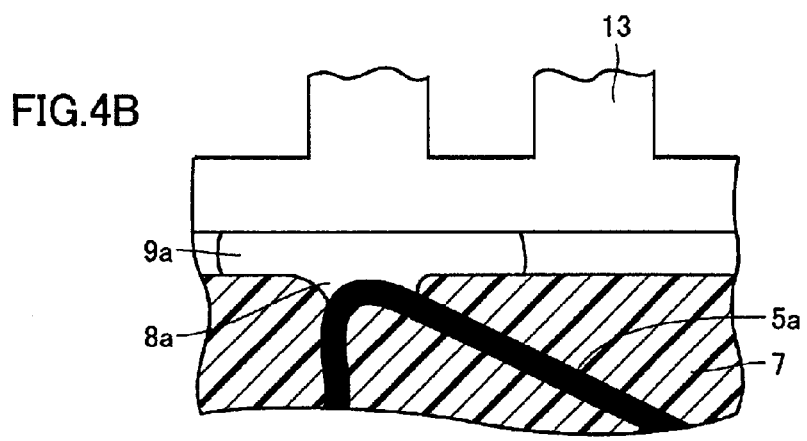

Referring to FIGS. 4A and 4B, the structure of a semiconductor device in a second embodiment and the contact relation between the semiconductor device and a cooling device will be described. The same or corresponding parts as/to those in the foregoing embodiment are designated by the same reference numerals and their detailed description will not be repeated.

Structure of Semiconductor Device

The basic structure of semiconductor device 10B in the second embodiment is similar to that of semiconductor device 10A in the first embodiment except that, as shown in FIG. 4A, conductive pastes 9a, and 9b are applied on and around contact terminals 8a and 8b, respectively.

In the case of constructing a closed circuit in which contact terminals 8a and 8b are regarded as switching elements between the semiconductor device and the cooling device as shown in FIG. 3A, contact terminals 8a and 8b have to be in contact with cooling device 13 with reliability. However, in a step of manufacturing semiconductor device 10B, for example, as shown in FIG. 4B, there may be a case in which conductor 5a is formed without being exposed from the surface 7A of package member 7. In such a case, contact terminal 8a does not have the function as a result. In order to avoid such a situation, as shown in FIG. 4B, conductive paste 9a, is applied on and around contact terminal 8a. With respect to contact terminal 8b as well, conductive paste 9b is applied from the viewpoint similar to the above.

Action and Effect

Semiconductor device 10B in the second embodiment can also produce action and effect similar to those of semiconductor device 10A in the first embodiment. Further, by applying conductive pastes 9a, and 9b on and around contact terminals 8a and 8b, particularly in the case of constructing the closed circuit as shown in FIG. 3A, the stable contact between contact terminals 8a and 8b and cooling device 13 is realized, and conduction between contact terminals 8a and 8b and cooling device 13 can be achieved with reliability.

Third Embodiment

The structure of a semiconductor device in a third embodiment will now be described by referring to FIGS. 5A and 5B. The same or corresponding parts as/to those in the foregoing embodiments are designated by the same reference numerals and their detailed description will not be repeated.

Figure 5A:
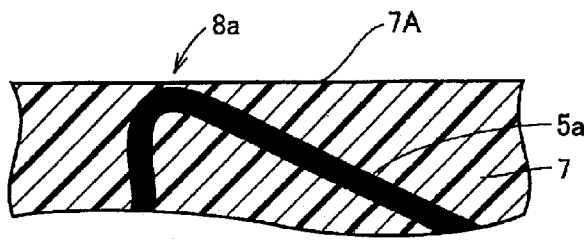
FIG. 5A is a diagram showing a first manufacturing step of a semiconductor device in a third embodiment.
Figure 5B:
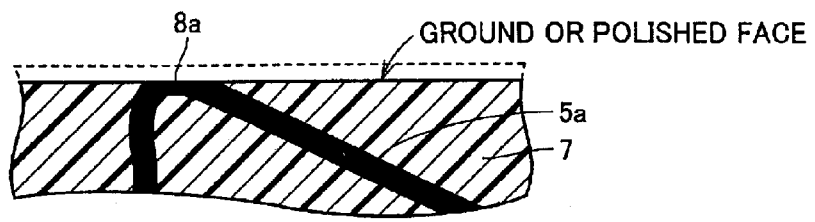
FIG. 5B is a diagram showing a second manufacturing step of the semiconductor device in the third embodiment.

In the semiconductor device in the third embodiment, as shown in the cross section of FIG. 5A, a semiconductor element of the semiconductor device is sealed with a resin of package member 7 and, after that, the surface 7A of package member 7 is ground or polished as shown in the cross section of FIG. 5B, thereby forming contact terminal 8a. Contact terminal 8b in the first and second embodiments is similarly formed.

Action and Effect

By exposing conductor 5 by grinding or polishing the surface 7A of package member 7, contact terminal 8a is formed. Consequently, in the case where it is difficult to form contact terminals exposed in the surface 7A by a conventional manufacturing method such as a case where a film of resin is formed on the surface of the conductor, the contact terminal exposed in the surface 7A with reliability can be formed.

Fourth Embodiment

Figure 6:
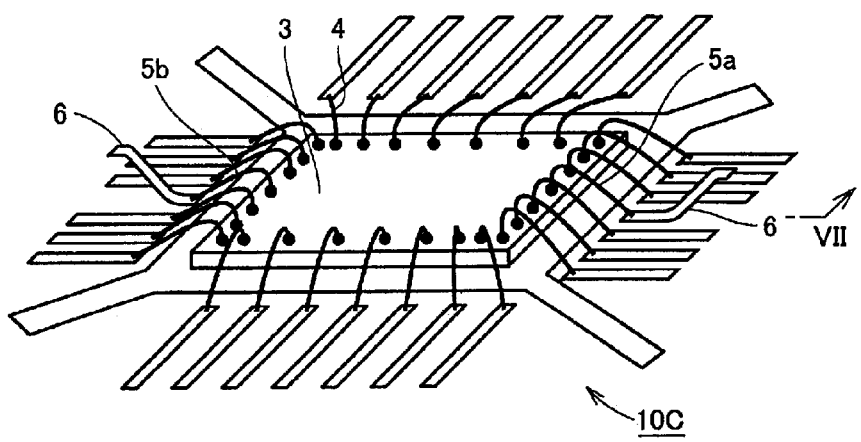
FIG. 6 is a general perspective view of the structure (except for a package member 7) of a semiconductor device 10C in a fourth embodiment.
Figure 7:
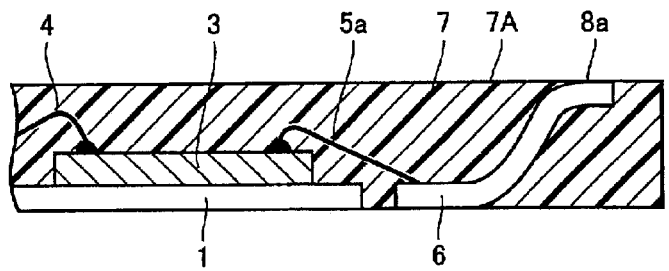
FIG. 7 is a cross section taken along line VII of FIG. 6.

The structure of a semiconductor device in a fourth embodiment will now be described by referring to FIG. 6. The same or corresponding parts as/to those in the foregoing embodiments are designated by the same reference numerals and their detailed description will not be repeated.

In the semiconductor device in each of the foregoing embodiments, selected conductors 5a (5b) are formed in loops which open downwards, thereby forming contact terminals 8a and 8b in the positions where the apexes of the loops are exposed.

In semiconductor device 10c in the fourth embodiment, by bending, not conductors, but selected internal electrode 6 upward and exposing it in the surface 7A of package member 7, contact terminal 8a is formed. Contact terminal 8b is similarly formed by exposing internal electrode 6 from the surface 7A of package member 7.

Action and Effect

Also by employing the configuration of exposing internal electrode 6 in place of conductor 5, action and effect similar to those in the first embodiment can be obtained. It is also possible to apply the configurations shown in the second and third embodiments to internal electrode 6. In this case as well, similar action and effect can be obtained.

Although the case of using the fin-type cooling device has been described in each of the foregoing embodiments, the invention is not limited to the fin-type cooling device but can be applied to cooling devices of every type.

Although the case of providing the contact terminals in two positions on the mounting face on which the cooling device is mounted, of the semiconductor has been described above, it is also possible to provide a plurality of contact terminals in a plurality of positions, divide the mounting face into sections, and determine the degree of contact between the semiconductor device and the cooling device in each section.

In the semiconductor device and the method of manufacturing the same according to the invention, by enabling the degree of contact between cooling means and a semiconductor device to be measured, in the case where it is determined that a deviation occurs in attachment between the cooling device and the semiconductor device, by restricting or interrupting the supply of power to the semiconductor device, erroneous operation of the semiconductor device and deterioration and destruction in the semiconductor device due to a sharp temperature rise can be avoided. Thus, the operation reliability of the semiconductor device can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor chip including electrodes;
   a plurality of leads;
   a plurality of wires connecting respective electrodes to corresponding leads;
   a resin encapsulating the semiconductor chip, parts of the plurality of leads, and the wires, two of the wires being partially exposed at a surface of the resin for measurement of an electrical characteristic between the two wires.

2. The semiconductor device according to claim 1, including an electrically conductive paste on and around the two wires at the surface.

3. The semiconductor device of claim 1 comprising an electrically conductive heat radiator mounted on the surface of the resin and means for measuring electrical conductivity between the two wires to determine degree of contact between the heat radiator and the resin.

4. The semiconductor device of claim 1 comprising:
   a heat radiator mounted opposite the surface of the resin;
   an electrically insulating film interposed between and contacting the heat radiator and the surface; and
   means for measuring capacitance between the two wires to determine degree of contact between the heat radiator and the resin.

5. A semiconductor device comprising:
   an electrically conductive heat radiator;
   a semiconductor chip including electrodes;
   a plurality of internal electrodes;
   a plurality of wires connecting respective electrodes to corresponding internal electrodes;
   a resin encapsulating the semiconductor chip, parts of the plurality of internal electrodes, and the wires, wherein two of the internal electrodes are partially exposed at a surface of the resin
   an electrically insulating film interposed between and contacting the heat radiator and the surface; and
   means for measuring capacitance between the two wires to determine degree of contact between the heat radiator and the resin.

6. A semiconductor device comprising:
   an electrically conductive heat radiator;
   a semiconductor chip including electrodes;
   a plurality of internal electrodes;
   a plurality of wires connecting respective electrodes to corresponding internal electrodes; and
   a resin encapsulating the semiconductor chip, parts of the plurality of internal electrodes, and the wires, wherein the electrically conductive heat radiator is mounted on a surface of the resin and two of the internal electrodes are partially exposed at the surface of the resin for measurement of electrical conductivity between the two internal electrodes to determine degree of contact between the heat radiator and the resin.

* * * * *